(12) United States Patent
Hung

(10) Patent No.: US 6,478,166 B2
(45) Date of Patent: Nov. 12, 2002

(54) FLEXIBLE STORAGE RACK

(75) Inventor: Kuo-Chuan Hung, Lu-Chou (TW)

(73) Assignee: Chun Long Metal Co., Ltd., Lu-Chou (TW)

( * ) Notice: Subject to any disclaimer, the term of this patent is extended or adjusted under 35 U.S.C. 154(b) by 0 days.

(21) Appl. No.: 09/793,099

(22) Filed: Feb. 27, 2001

(65) Prior Publication Data

US 2002/0117462 A1 Aug. 29, 2002

(51) Int. Cl.[7] .................................................. A47F 5/00
(52) U.S. Cl. ........................ 211/26; 211/175; 211/189; 312/265.4; 312/223.2; 361/683
(58) Field of Search ......................... 211/26, 175, 189; 312/265.1, 265.2, 265.3, 265.4, 265.5, 265.6, 223.2; 361/683, 829

(56) References Cited

U.S. PATENT DOCUMENTS

| | | | | |
|---|---|---|---|---|
| 3,332,558 A | * | 7/1967 | Wilson | |
| 3,563,627 A | * | 2/1971 | Whipps | |
| 5,284,254 A | * | 2/1994 | Rinderer | 211/26 |
| 5,326,162 A | * | 7/1994 | Bovermann | 312/265.1 |
| 5,542,549 A | * | 8/1996 | Siemon et al. | 211/26 |
| 5,639,150 A | * | 6/1997 | Anderson et al. | 312/265.3 |
| 5,819,956 A | * | 10/1998 | Rinderer | 211/26 |
| 6,006,925 A | * | 12/1999 | Sevier | 211/26 |
| 6,223,908 B1 | * | 5/2001 | Kurtsman | 211/26 |
| 6,279,756 B1 | * | 8/2001 | Walter et al. | 211/26 |

* cited by examiner

Primary Examiner—Robert W. Gibson, Jr.
(74) Attorney, Agent, or Firm—Jacobson Holman PLLC

(57) ABSTRACT

A flexible storage rack including a pair of base bars, multiple frames, a pair of stand braces, several adjustable stretchers and supporting boards to make it more sturdy. The large area base bars also make the rack more stable. The flexible storage rack has different assembly methods for different applications; multiple variations offer more flexibility.

3 Claims, 6 Drawing Sheets

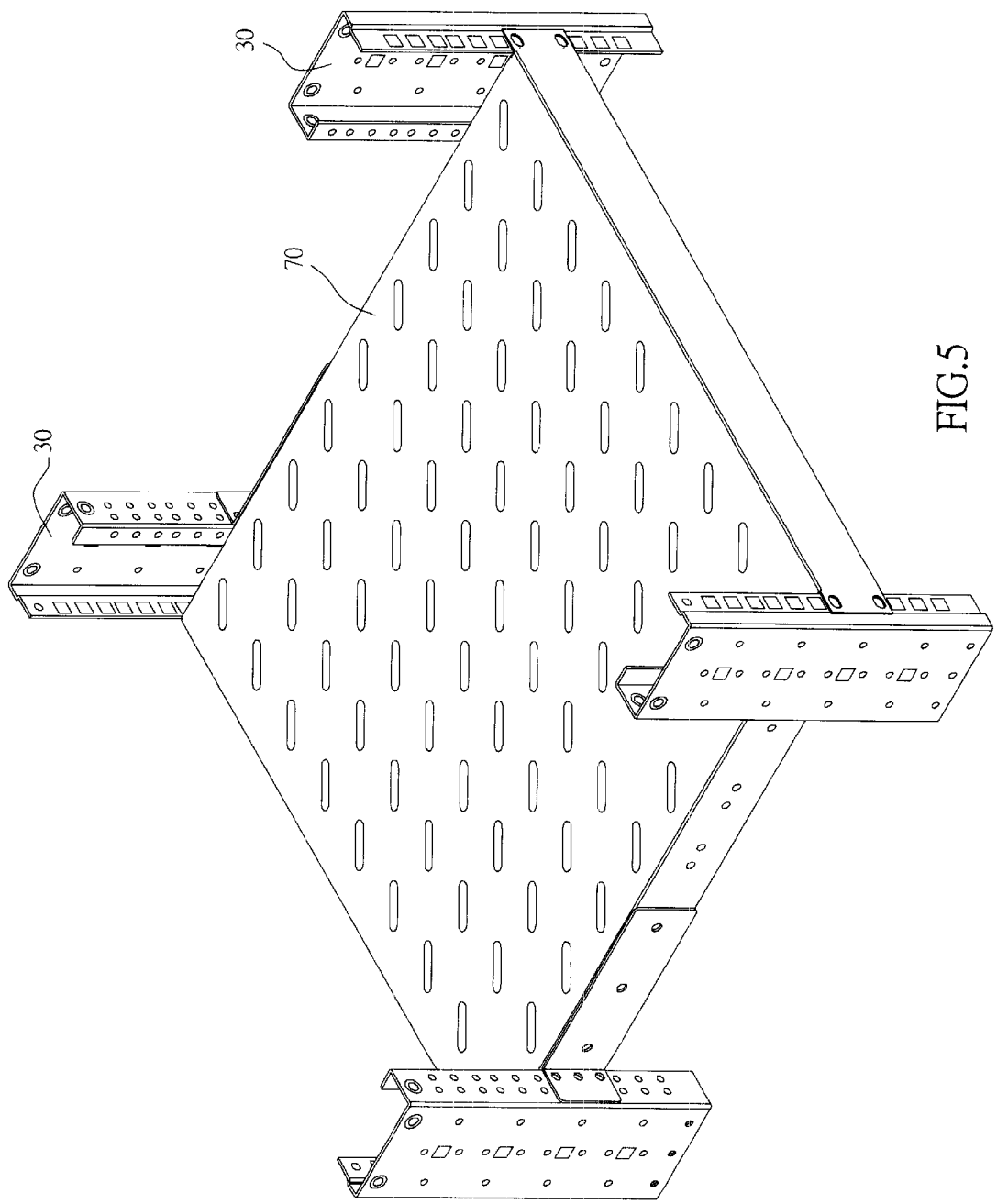

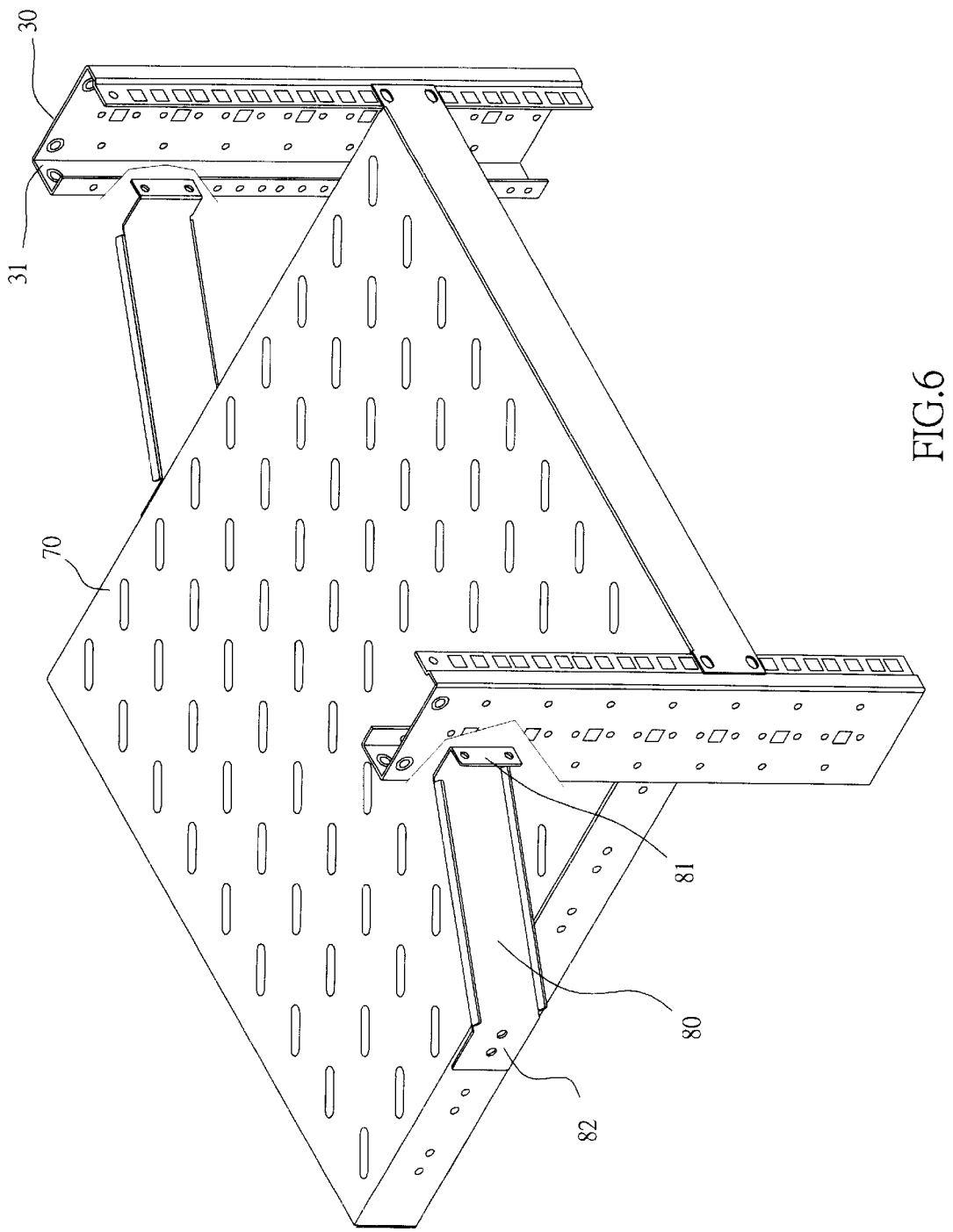

FLEXIBLE STORAGE RACK

BACKGROUND OF THE INVENTION

I. Field of the Invention

This invention relates generally to a flexible storage rack and, more specifically, to a flexible storage rack that is sturdily built by multiple methods, and including a pair of base bars with multiple frames to form an adjustable space to store different objects.

II. Description of the Prior Art

Heretofore, it is known to store an electronics apparatus on a rack to be seen and accessed from different directions. However most of the racks are a fixed structure: a frame with several mount boards fixed in place and cannot be changed once it is built. It is very difficult to rearrange the space of this structure to fit different objects with different sizes.

SUMMARY OF THE INVENTION

It is therefore a primary object of the invention to provide a flexible storage rack comprising a base, multiple frame, a pair of stand braces, several adjustable extension bars and supporting boards for sturdiness. The large area base bars also make the rack more stable.

It is an objective of this invention to provide a flexible storage rack formed by different assembly methods for different applications, and capable of forming multiple variations to offer more flexibility.

BRIEF DESCRIPTION OF THE DRAWINGS

The accomplishment of the above-mentioned object of the present invention will become apparent from the following description and its accompanying drawings which disclose a preferred embodiment of the present invention, and are described as follows:

FIG. 5 is another assembly variation of the present invention; and

FIG. 6 is another assembly variation of the present invention.

DETAILED DESCRIPTION OF THE PREFERRED EMBODIMENT

Figure 1:
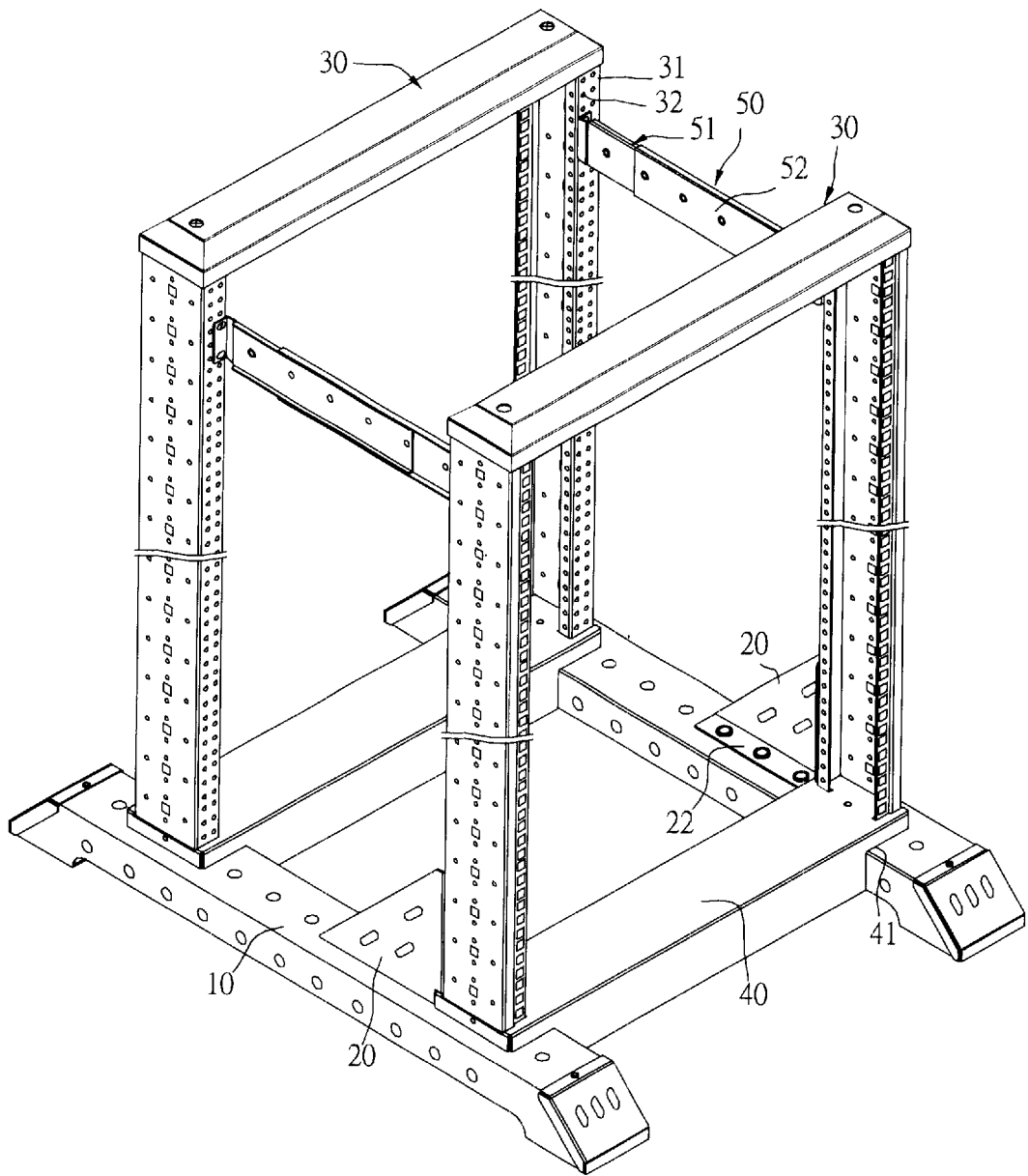
FIG. 1 is a perspective view of the present invention.
Figure 2:
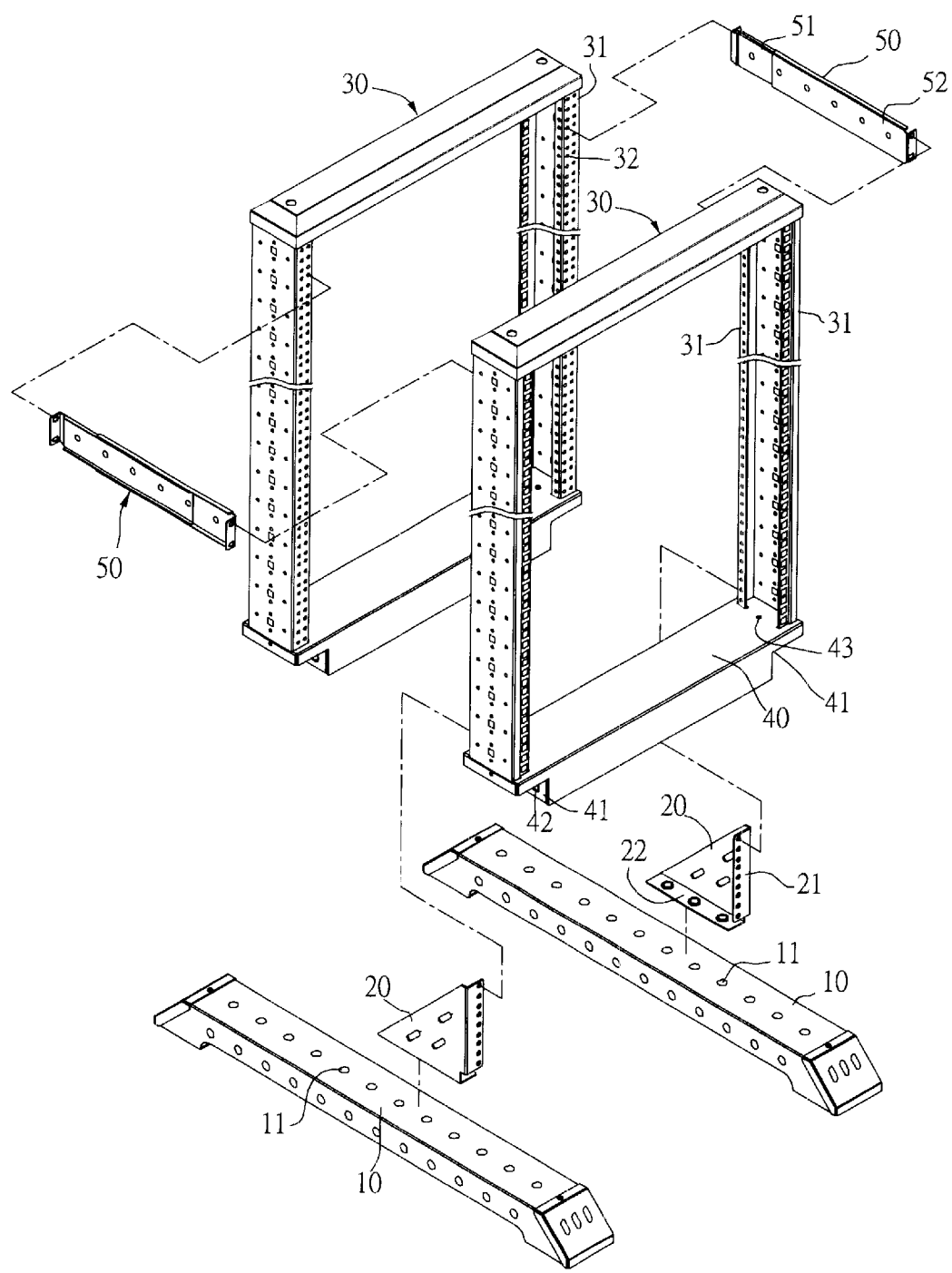
FIG. 2 is an exploded view of an embodiment of the present invention.

Referring to FIG. 1 and FIG. 2, the present invention is composed of a pair of base bars 10 in a long arch sharp having several screw holes 11 on the top and inner side spaced apart by an equal distance.

One or more frames 30 are mounted on the base 10. The frame 30 includes an inverted U-shaped bar 30a formed on the top of frame 30. The cross section of two pillars 30b, 30c of the U-shaped bar is bent at 90° on two sides having an equal length to form two side folds 31. Each side fold 31 is covered with two rows of screw holes 32 to fasten with other objects. The bottom part of frame 30 is a stand brace 40 having a flat top located between two base bars 10. Stand brace 40 has several screw holes 42, with one indention 41 on both ends of stand brace 40. The side holes 42 are located on the vertical sides of indention 41. Frame 30 is mounted across two base bars 10. Stand brace 40 is placed with indentions 41 having one side on top of the base bar and one side on the side of the base bar 10. Screws are passed through screw holes 11 of base bar 10 and side holes 42 of stand brace 40 and fastened firmly with nuts.

Supporting corner board 20 is in a triangle shape with two sides bent in at an angle of 90° to form two side folds 21 and 22. Side folds 21 and 22 have screw holes corresponding to screw holes 11 of base bar 10 and screw holes 32 of frame 30. This arrangement makes the side folds be fastened together more accurately and sturdily.

Figure 3:
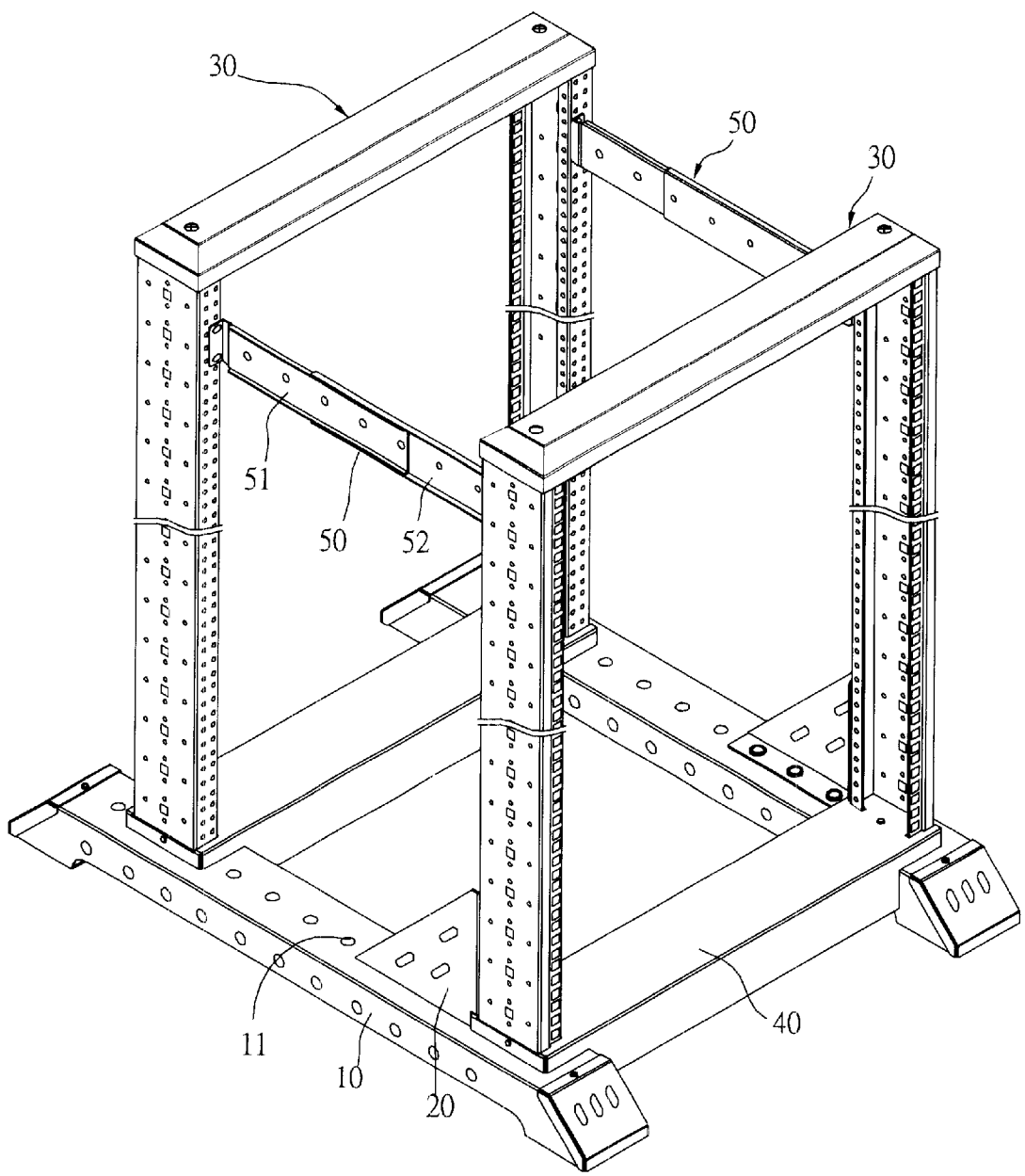
FIG. 3 is another perspective view of the present invention.

Referring to FIG. 1 and FIG. 3, an adjustable extension bar 50 consists of two long track boards 51 and 52. When more than two frames 30 are mounted on base 10, two track board 51 and 52 of extension bar 50 are fixed on screw holes 32 on the upper portion of frame 30. Two frames 30 are fixed with two adjustable extension bars 50 to be mounted on base bar 10.

Figure 4:
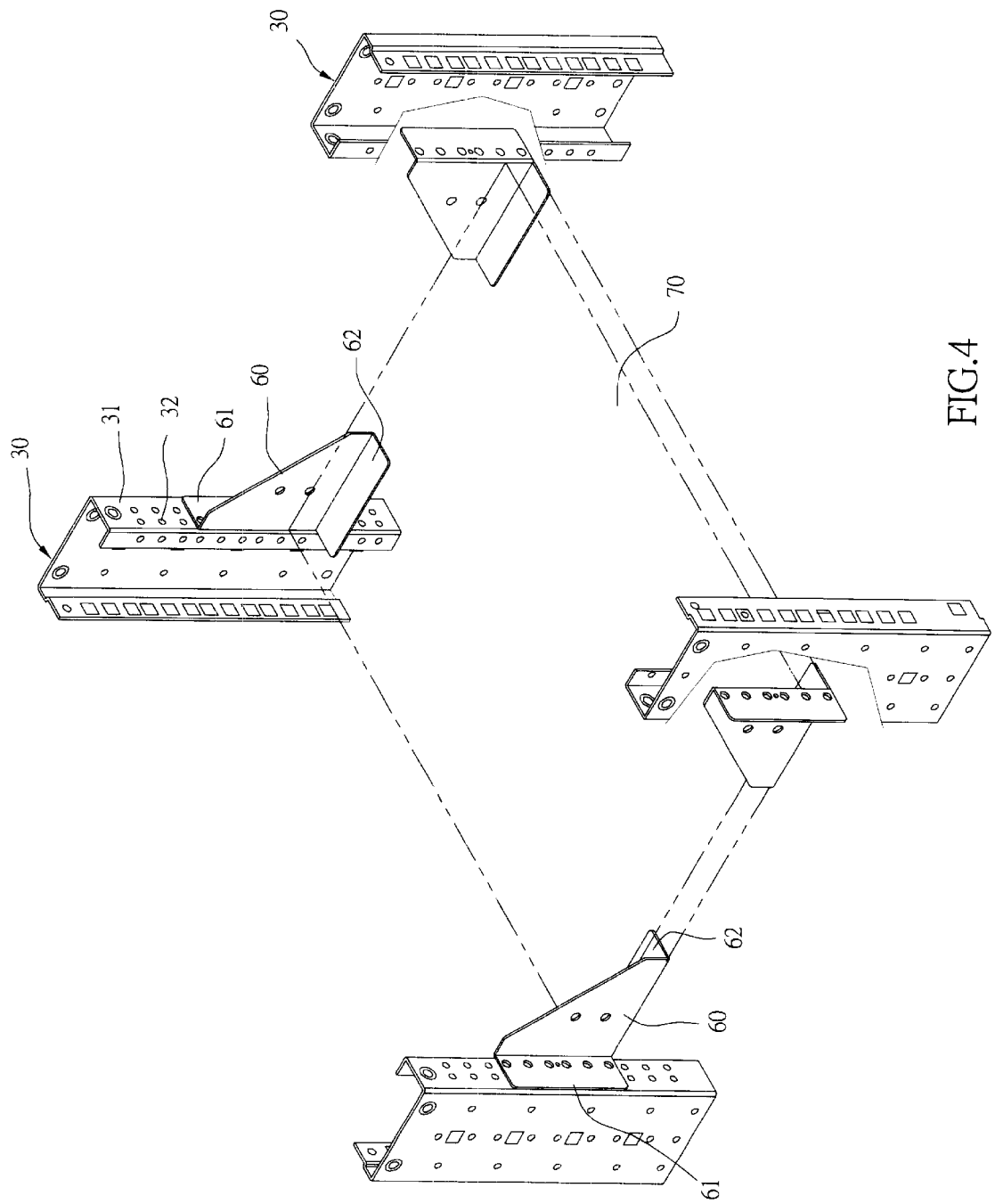
FIG. 4 is an exploded view of an embodiment of assembly of the present invention.

Referring to FIG. 1 and FIG. 4, the four pillars of two frames 30 each has a triangle shape supporting board 60 attached. The supporting board 60 has a vertical side fold 61 and a horizontal side fold 62 on two sides. The vertical side fold 61 is fastened firmly in screw hole 32 of the pillar 30b of frame 30 with screws and nuts; four horizontal side folds 62 support a mounting board 70.

Different ways to assemble mounting board 70 are shown with reference to FIG. 5 where mounting board 70 is equipped with a side fold to firmly attach to frame 30. Referring to FIG. 6, a "Z" shape supporting board 80 has a side fold 81 and a fastening end 82. Fastening end 82 of the supporting board 80 is fixed to the middle of the mounting board 70. Side fold 81 is fastened on frame 30. This is another way to firmly fix the mounting board 70.

While a preferred embodiment of the invention has been shown and described in detail, it will be readily understood and appreciated that numerous omissions, changes and additions may be made without departing from the spirit and scope of the invention.

What is claimed is:

1. A flexible storage rack comprising:

a pair of base bars each formed in a substantially elongated shape, several screw holes being disposed on a top and an inner side of each base bar at an equal separation distance, at least one frame mounted on said base bars, each frame including an inverted U-shaped bar and two pillars being fitted at each of two sides of said U-shaped bar, two side folds being bent at 90° on sides of said pillars, said side folds being provided with two rows of screw holes, a stand brace with a flat top located beneath said frame and between said base bars, said stand brace being provided with several screw holes on edges of the top thereof, one indentation being formed at each end of said stand brace, each said indentation having two perpendicular surfaces and several holes on a vertical one of said surfaces, said frame being mounted across said base bars while the other surface of said indentations of said stand brace lies on a top of said base bars and the vertical surface of said indentation contacts an inner side of said base bars, screws being passed through said screw holes of said base bar and said side holes of said stand brace, thereby fastening said side bar and said stand brace together, a supporting corner board with two sides bent at 90° to form two side folds, said two side folds having screw holes corresponding to said screw holes of said base bar and said screw holes of said frame, and an adjustable extension bar including two track boards to fix two of said frames together, said track boards being fixed to an upper portion of said frames.

2. The flexible storage rack recited in claim 1, wherein a triangular shaped supporting board is attached to each pillar of said frame, said supporting board includes a vertical side fold and a horizontal side fold on two sides thereof, and said vertical side fold is fastened to the pillars of said frame with screws and nuts, and four of said horizontal side folds supports a mounting board.

3. The flexible storage rack recited in claim 1, wherein a Z-shaped supporting board includes a side fold and a fastening end, and said fastening end is fixed to a mounting board while said side fold is fastened to said frame.

* * * * *